US012654387B2

(12) United States Patent (10) Patent No.: US 12,654,387 B2
Kitayama (45) Date of Patent: Jun. 16, 2026

(54) IMPRINT APPARATUS, IMPRINT METHOD, AND ARTICLE MANUFACTURING METHOD

(71) Applicant: CANON KABUSHIKI KAISHA, Tokyo (JP)

(72) Inventor: Fumiaki Kitayama, Tochigi (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 203 days.

(21) Appl. No.: 18/678,440

(22) Filed: May 30, 2024

(65) Prior Publication Data

US 2024/0408811 A1 Dec. 12, 2024

(30) Foreign Application Priority Data

Jun. 8, 2023 (JP) ................................. 2023-094909

(51) Int. Cl.
| | |
|---|---|
| *B29C 41/02* | (2006.01) |
| *B29C 37/00* | (2006.01) |
| *B29C 41/38* | (2006.01) |
| *B29C 41/52* | (2006.01) |
| *B29C 43/36* | (2006.01) |
| *B29C 59/00* | (2006.01) |

(Continued)

(52) U.S. Cl.
CPC ........ *B29C 59/002* (2013.01); *B29C 37/0053* (2013.01); *G03F 7/0002* (2013.01); *G03F 9/7023* (2013.01); *G03F 9/7042* (2013.01); *G03F 9/7065* (2013.01); *G03F 9/7069* (2013.01); *G03F 9/7088* (2013.01); *B29C 2037/90* (2013.01); *B29C 2043/025* (2013.01); *B29C 2043/5833* (2013.01); *B29C 2043/5891* (2013.01)

(58) Field of Classification Search
CPC . B29C 37/0053; B29C 2037/90; B29C 41/02; B29C 41/38; B29C 41/52; B29C 2043/025; B29C 43/36; B29C 2043/5833; B29C 2043/5891; B29C 59/02; B29C 2059/023; G03F 7/0002; G03F 9/7023; G03F 9/7042; G03F 9/7065; G03F 9/7069; G03F 9/7088
USPC ....... 264/40.1, 259, 319, 494, 496; 425/110, 425/135, 150, 169, 171, 470
See application file for complete search history.

(56) References Cited

U.S. PATENT DOCUMENTS

| | | | | |
|---|---|---|---|---|
| 2012/0225152 A1* | 9/2012 | Wuister | ................ | G03F 9/7088 |
| | | | | 425/150 |
| 2019/0079391 A1 | 3/2019 | Fukuhara et al. | | |

FOREIGN PATENT DOCUMENTS

| | | |
|---|---|---|
| JP | 2008504141 A | 2/2008 |
| JP | 2019050313 A | 3/2019 |

(Continued)

*Primary Examiner* — Leo B Tentoni

(74) *Attorney, Agent, or Firm* — ROSSI, KIMMS & McDOWELL LLP

(57) ABSTRACT

An imprint apparatus that forms a pattern of a curable composition on a substrate by using a mold, includes an alignment mechanism configured to perform alignment between a shot region of the substrate and a pattern region of the mold, a curing device configured to cure the curable composition between the shot region and the pattern region by irradiating the curable composition with light, and a controller configured to change control information of the alignment by the alignment mechanism in accordance with a change of an irradiation condition of light by the curing device.

20 Claims, 7 Drawing Sheets

(51) Int. Cl.
  G03F 7/00 (2006.01)
  G03F 9/00 (2006.01)
  B29C 43/02 (2006.01)
  B29C 43/58 (2006.01)

(56) References Cited

FOREIGN PATENT DOCUMENTS

| | | | |
|---|---|---|---|
| KR | 1020190083988 | A | 7/2019 |
| KR | 1020200072404 | A | 6/2020 |
| KR | 1020200136825 | A | 12/2020 |
| WO | 2005121892 | A2 | 12/2005 |

* cited by examiner

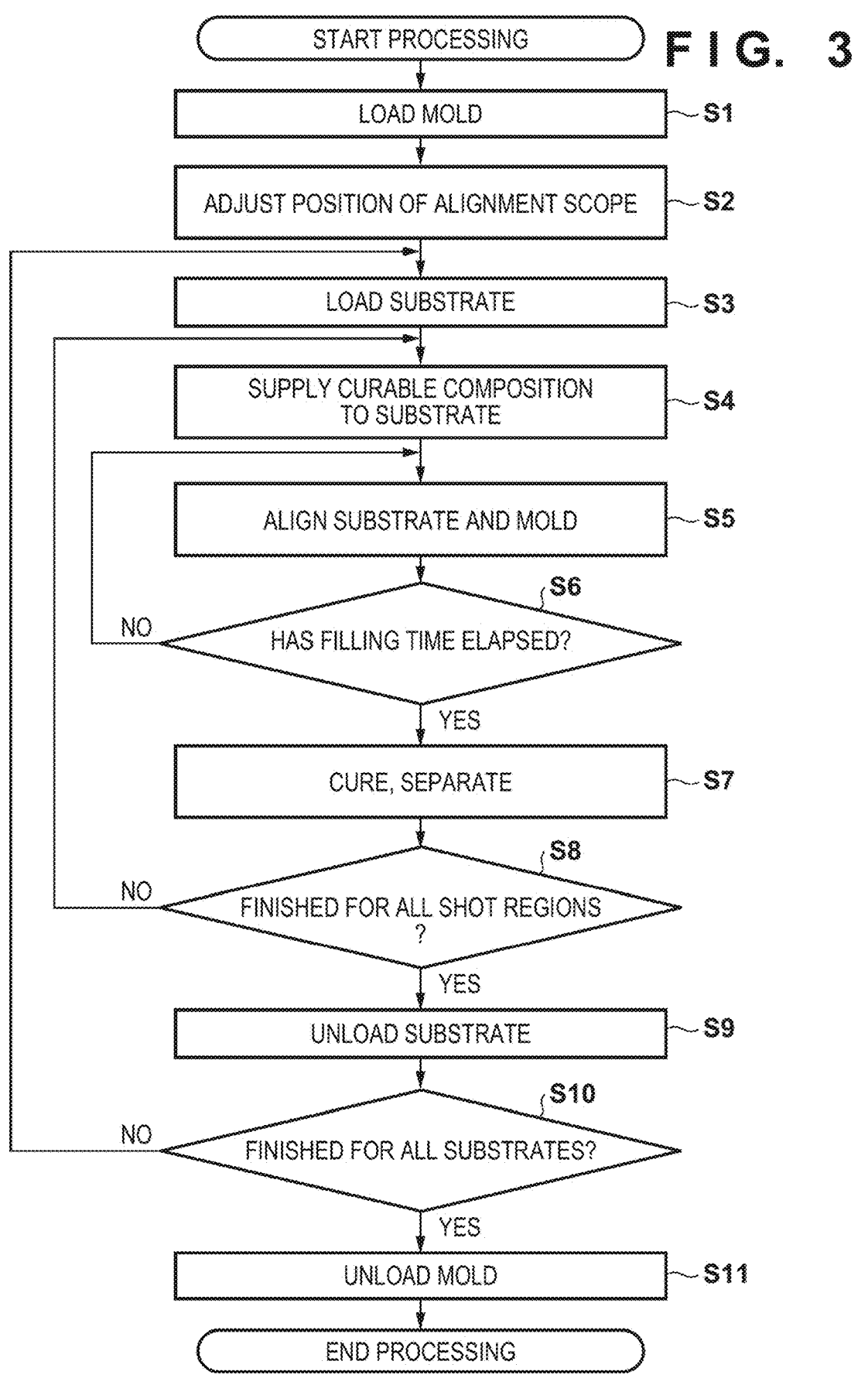
F I G. 3

FIG. 7

| SET ILLUMINANCE | MAGNIFICATION DIFFERENCE |
|---|---|
| IO | M_0 |
| IO+ΔI | M_1 |
| IO+2×ΔI | M_2 |
| ⋮ | ⋮ |
| IO+(N-1)×ΔI | M_N-1 |
| IO+N×ΔI | M_N |
| IO+(N+1)×ΔI | M_N+1 |
| ⋮ | ⋮ |
| IO+(M-1)×ΔI | M_M-1 |

| SHOT NUMBER | SET ILLUMINANCE |
|---|---|
| 1 | IO |
| 2 | IO+ΔI |
| 3 | IO+2×ΔI |
| ⋮ | ⋮ |
| N | IO+(N-1)×ΔI |
| N+1 | IO+N×ΔI |
| N+2 | IO+(N+1)×ΔI |
| ⋮ | ⋮ |
| M | IO+(M-1)×ΔI |

F I G.  8
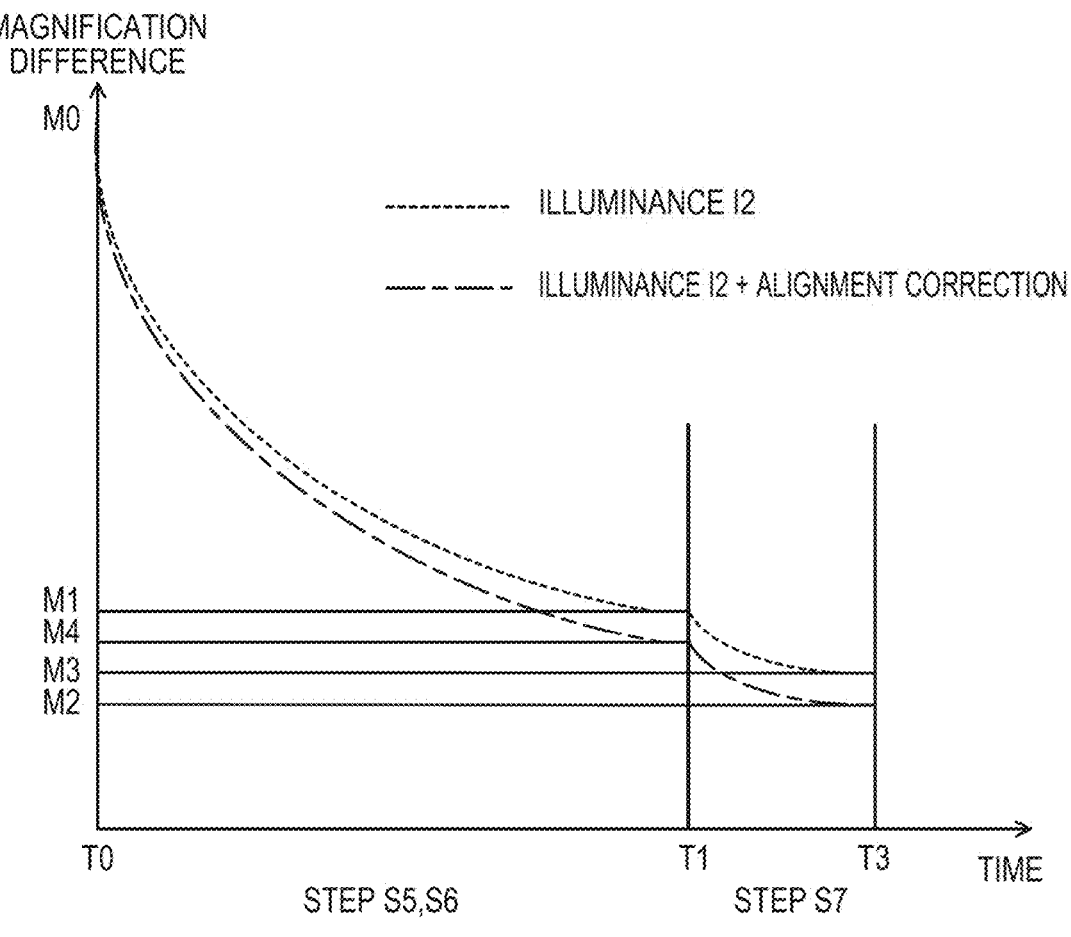

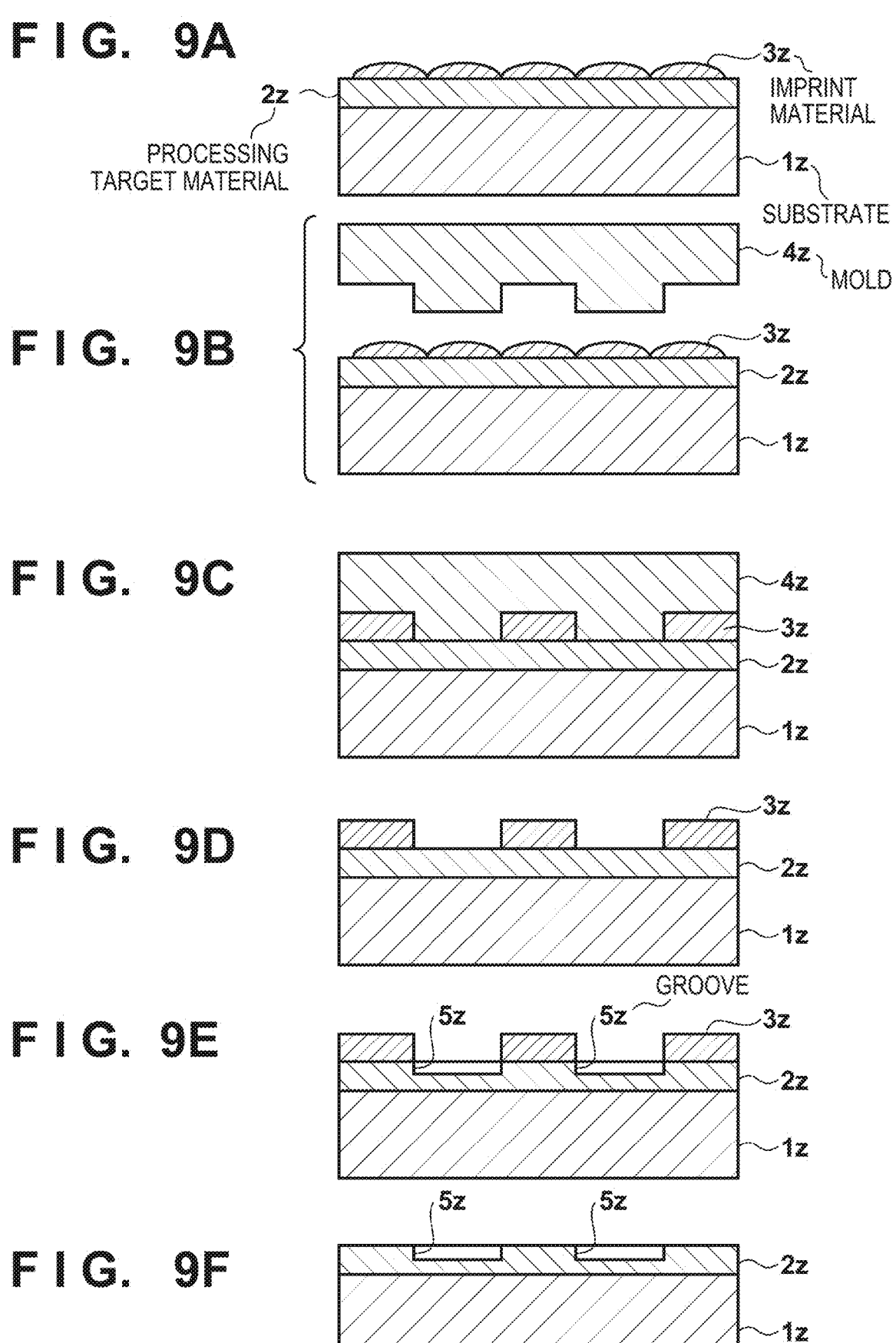
F I G. 9A
3z IMPRINT MATERIAL
2z PROCESSING TARGET MATERIAL
1z SUBSTRATE
F I G. 9B
4z MOLD
3z
2z
1z
F I G. 9C
4z
3z
2z
1z
F I G. 9D
3z
2z
1z
F I G. 9E
GROOVE
5z   5z   3z
2z
1z
F I G. 9F
5z   5z
2z
1z

IMPRINT APPARATUS, IMPRINT METHOD, AND ARTICLE MANUFACTURING METHOD

BACKGROUND OF THE INVENTION

Field of the Invention

The present invention relates to an imprint apparatus, an imprint method, and an article manufacturing method.

Description of the Related Art

There is known an imprint technique of forming a pattern made of the cured product of a curable composition on a substrate by using a mold (template). Japanese Patent Laid-Open No. 2008-504141 describes that a magnification error is compensated by deforming the mold. Japanese Patent Laid-Open No. 2019-50313 describes that the illuminance of light from an exposure source is changed during alignment between the substrate and the template.

SUMMARY OF THE INVENTION

If the irradiation condition of light with respect to the curable composition changes, the result of alignment between the substrate and the mold can change.

The present invention provides a technique advantageous in reducing the change of the alignment result caused by a change of the irradiation condition of light with respect to the curable composition.

One of aspects of the present invention provides an imprint apparatus that forms a pattern of a curable composition on a substrate by using a mold, comprising: an alignment mechanism configured to perform alignment between a shot region of the substrate and a pattern region of the mold; a curing device configured to cure the curable composition between the shot region and the pattern region by irradiating the curable composition with light; and a controller configured to change control information of the alignment by the alignment mechanism in accordance with a change of an irradiation condition of light by the curing device.

Further features of the present invention will become apparent from the following description of exemplary embodiments with reference to the attached drawings.

BRIEF DESCRIPTION OF THE DRAWINGS

FIG. 3 is a flowchart exemplarily showing the operation sequence of the imprint apparatus;

FIG. 6 is a view exemplarily showing assignment of illuminances to shot numbers;

FIG. 7 is a view exemplarily showing characteristic information indicating the relationship between an irradiation condition of light and an alignment error (overlay error);

FIG. 8 is a view showing an example of an alignment operation in a case of reflecting the alignment correction amount decided in accordance with the change of the irradiation condition on the alignment target value; and FIGS. 9A to 9F are views exemplarily showing an article manufacturing method.

DESCRIPTION OF THE EMBODIMENTS

Figure 1:
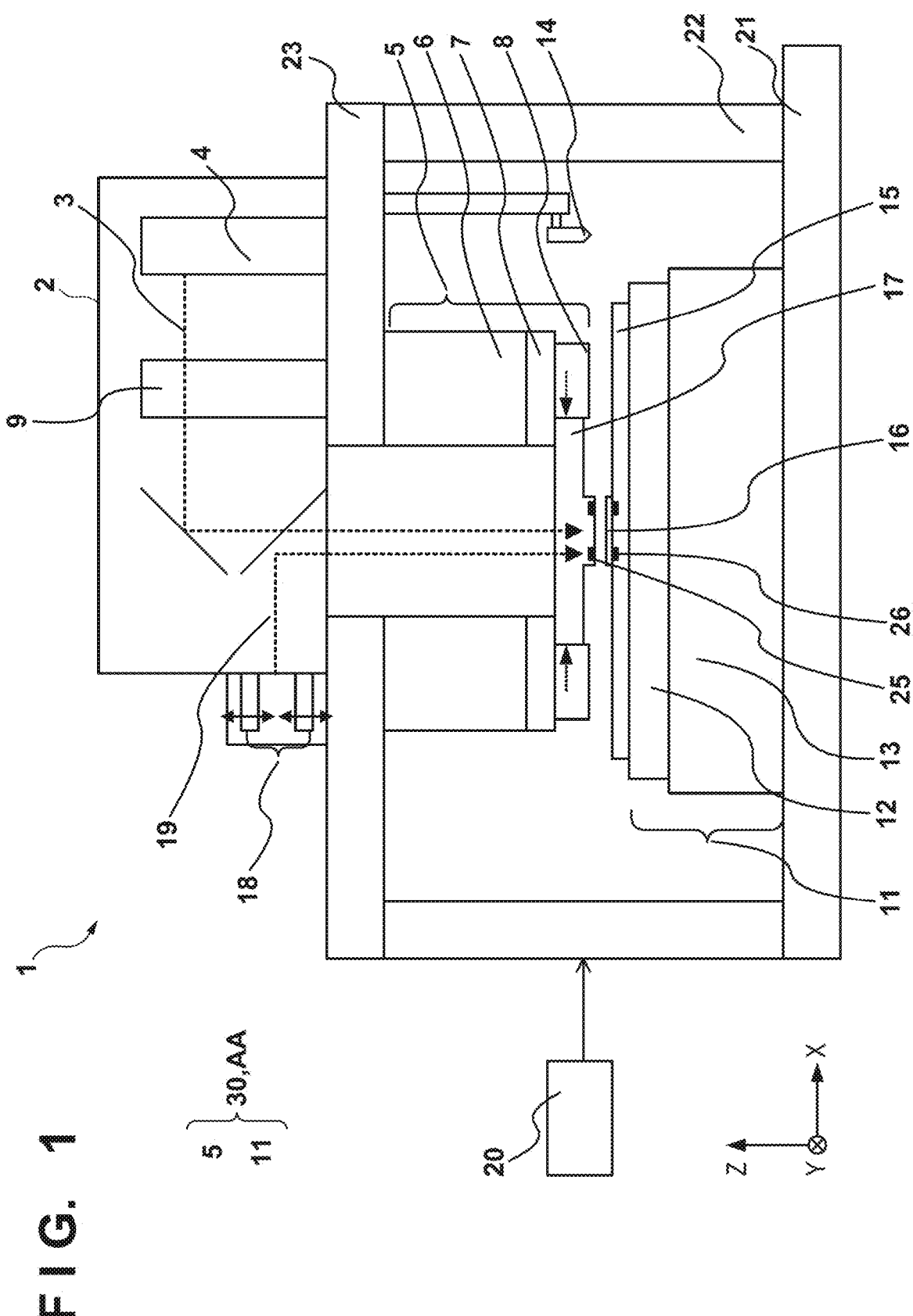
FIG. 1 is a view schematically showing the arrangement of an imprint apparatus according to an embodiment.

Hereinafter, embodiments will be described in detail with reference to the attached drawings. Note, the following embodiments are not intended to limit the scope of the claimed invention. Multiple features are described in the embodiments, but limitation is not made to an invention that requires all such features, and multiple such features may be combined as appropriate. Furthermore, in the attached drawings, the same reference numerals are given to the same or similar configurations, and redundant description thereof is omitted.

In the specification and the accompanying drawings, directions will be indicated on an XYZ coordinate system in which directions parallel to the surface of a substrate are defined as the X-Y plane. Directions parallel to the X-axis, the Y-axis, and the Z-axis of the XYZ coordinate system are the X direction, the Y direction, and the Z direction, respectively. A rotation about the X-axis, a rotation about the Y-axis, and a rotation about the Z-axis are $\theta X$, $\theta Y$, and $\theta Z$, respectively. Control or driving concerning the X-axis, the Y-axis, and the Z-axis means control or driving concerning a direction parallel to the X-axis, a direction parallel to the Y-axis, and a direction parallel to the Z-axis, respectively. In addition, control or driving concerning the $\theta X$-axis, the $\theta Y$-axis, and the $\theta Z$-axis means control or driving concerning a rotation about an axis parallel to the X-axis, a rotation about an axis parallel to the Y-axis, and a rotation about an axis parallel to the Z-axis, respectively. In addition, a position is information that can be specified based on coordinates on the X-, Y-, and Z-axes, and a posture is information that can be specified by values on the $\theta X$-, $\theta Y$-, and $\theta Z$-axes. Positioning means controlling the position and/or posture. Alignment can include controlling the position and/or posture of at least one of a substrate and a mold such that the alignment error (overlay error) between the shot region of the substrate and the pattern region of the mold decreases. In addition, alignment can include control to correct or change the shape of at least one of the shot region of the substrate and the pattern region of the mold.

FIG. 1 shows the arrangement of an imprint apparatus 1 according to an embodiment of the present disclosure. The imprint apparatus 1 can be configured to form a pattern made of the cured product of a curable composition 16 on a substrate 15 by using a mold 17. The imprint apparatus 1 can include, for example, a substrate driving mechanism 11, a mold driving mechanism 5, a dispenser 14, an alignment measurement device 18, a curing device 2, and a controller 20.

The substrate 15 can be, for example, a single-crystal silicon wafer or a Silicon on Insulator (SOI) wafer, but may be another substrate. A curable composition serving as an imprint material can be supplied, arranged, or applied onto the processing target surface of the substrate 15 by the dispenser 14.

The substrate driving mechanism 11 holds and drives the substrate 15. The mold driving mechanism 5 holds and drives the mold 17. The substrate driving mechanism 11 and the mold driving mechanism 5 can form a relative driving mechanism 30 that relatively drives the shot region of the substrate 15 and the pattern region of the mold 17. The relative driving between the shot region of the substrate 15 and the pattern region of the mold 17 by the relative driving mechanism 30 can include driving for bringing the pattern region of the mold 17 into contact with the curable composition 16 on the substrate 15 and separating the mold 17 from the cured product of the curable composition 16. The relative driving mechanism 30 can form an alignment mechanism AA that performs alignment between the shot region of the substrate 15 and the pattern region of the mold 17.

The substrate driving mechanism 11 can include a substrate stage 12 including a substrate holding unit (not shown) for holding the substrate 15, and a substrate driving actuator 13 that drives the substrate 15 by driving the substrate stage 12. The substrate driving mechanism 11 can be configured to drive the substrate 15 in a plurality of axes (for example, three axes of the X-axis, the Y-axis, and the θZ-axis, and preferably six axes of the X-axis, the Y-axis, the Z-axis, the θX-axis, the θY-axis, and the θZ-axis). The mold driving mechanism 5 can include a mold holding unit 7 for holding the mold 17, and a mold driving actuator 6 that drives the mold 17 by driving the mold holding unit 7. The mold driving mechanism 5 can be configured to drive the mold 17 in a plurality of axes (for example, three axes of the Z-axis, the θX-axis, and the θY-axis, and preferably six axes of the X-axis, the Y-axis, the Z-axis, the θX-axis, the θY-axis, and the θZ-axis).

Figure 2:
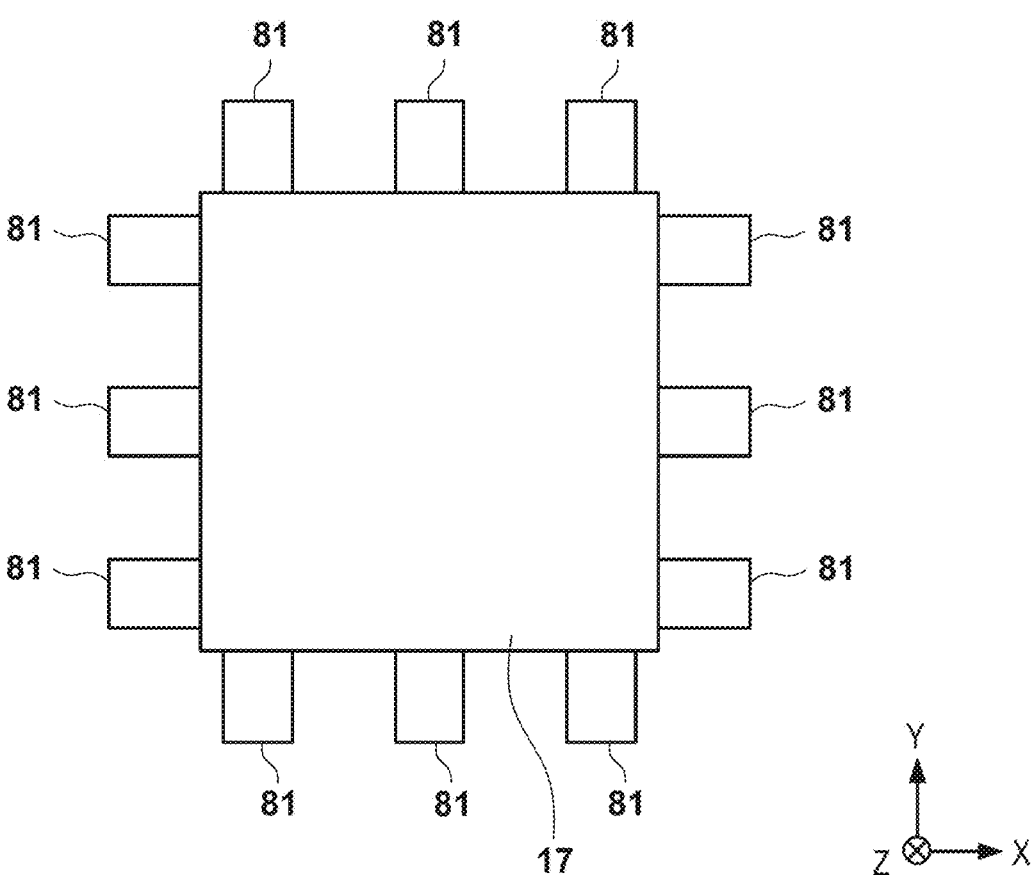
FIG. 2 is a view schematically showing an example of a mold deformation mechanism.

The imprint apparatus 1 can include a mold deformation mechanism 8 that deforms the mold 17. The mold deformation mechanism 8 can deform the mold 17 by, for example, applying a force to the side surface of the mold 17. The mold deformation mechanism 8 can form a part of the alignment mechanism AA. FIG. 2 exemplarily shows the arrangement of the mold deformation mechanism 8. The imprint apparatus 1 may include a substrate deformation unit that deforms the shot region of the substrate 15 by giving the substrate 15 a heat distribution by infrared light or the like. The substrate deformation unit can also form a part of the alignment mechanism AA.

The dispenser 14 is a device for supplying, arranging, or applying the curable composition 16 onto the substrate 15. The dispenser 14 includes a discharge nozzle (not shown), and can be configured to discharge (for example, drop) the curable composition 16 onto the substrate 15 from the discharge nozzle. The dispenser 14 is not an essential component, and if the imprint apparatus 1 does not include the dispenser 14, the substrate 15 with the curable composition 16 arranged thereon by an external dispenser can be provided to the imprint apparatus 1.

The curable composition is cured by receiving curing energy, which is light in this embodiment. The light serving as the curing energy can be, for example, light selected from the wavelength range of 10 nm (inclusive) to 1 mm (inclusive), for example, infrared light, a visible light beam, or ultraviolet light. The curable composition contains at least a polymerizable compound and a photopolymerization initiator, and may further contain a nonpolymerizable compound or a solvent, as needed. The nonpolymerizable compound is at least one material selected from the group consisting of a sensitizer, a hydrogen donor, an internal mold release agent, a surfactant, an antioxidant, and a polymer component. The curable composition can be arranged on the substrate in the form of droplets or in the form of an island or film formed by connecting a plurality of droplets. The curable composition may be supplied onto the substrate in the form of a film by a spin coater or a slit coater. The viscosity (the viscosity at 25° C.) of the curable composition can be, for example, 1 mPas (inclusive) to 100 mPa's (inclusive).

The curing device 2 can be configured to cure the curable composition 16 by irradiating the curable composition 16 with light 3. More specifically, the curing device 2 can cure the curable composition 16 by irradiating the curable composition 16 between the shot region of the substrate 15 and the pattern region of the mold 17 with the light 3 after alignment by the alignment mechanism AA. The curing device 2 may start irradiation of the curable composition 16 between the shot region of the substrate 15 and the pattern region of the mold 17 with the light 3 before alignment by the alignment mechanism AA is completed. The curing device 2 can include, for example, a light source 4 that generates the light 3 for curing the curable composition 16, and an adjustment unit 9 that adjusts the irradiation condition (for example, the illuminance, the exposure amount, or the illuminance distribution in the shot region) of the light 3 with respect to the curable composition 16. As the light source 4, for example, an ultraviolet lamp, an ultraviolet LED, a Laser, or the like can be employed. The adjustment unit 9 can have a function of changing the energy input to the light source 4 (for example, the power input to the lamp or the current input to the LED). Alternatively, the adjustment unit 9 may use an ND filter that can change the illuminance of the light 3, or the like. Alternatively, the adjustment unit 9 may include, for example, a Digital Micromirror Device (DMD) arranged in the optical path of the light 3 to change the luminance distribution in the shot region of the substrate.

The alignment measurement device 18 can include an alignment scope. The alignment scope can include an optical system, an image capturing unit (for example, a CCD camera), and an illumination unit. To measure the shape of the shot region of the substrate 15 and the shape of the pattern region of the mold 17, the alignment measurement device 18 can measure the relative positions between a plurality of substrate-side marks 26 provided in the shot region of the substrate 15 and a plurality of mold-side marks 25 provided in the mold 17. The substrate-side marks 26 and the mold-side marks 25 can be called alignment marks. The substrate-side mark 26 and the mold-side mark 25 can form a mark pair. Normally, by measuring the relative position (positional shift) between the substrate-side mark 26 and the mold-side mark 25 for each of a plurality of mark pairs, it is possible to detect the alignment error (overlay error) between the shot region of the substrate 15 and the pattern region of the mold 17. The alignment error can include the shape difference between the shot region of the substrate 15 and the pattern region of the mold 17. Alternatively, the alignment error can include the magnification difference between the shot region of the substrate 15 and the pattern region of the mold 17. Alternatively, the alignment error can include, for example, positional shift information in the X-axis direction, the Y-axis direction, and the θ-axis direction, and shape difference information such as the magnification shift or trapezoidal shift between the shot region of the substrate 15 and the pattern region of the mold 17.

The alignment measurement device 18 may include a plurality of alignment scopes to simultaneously measure the plurality of mark pairs. The positions of the mark pairs can depend more on, for example, the size of the shot region, the device pattern design, and the like. Hence, the alignment measurement device 18 may include a driving mechanism for moving the alignment scope so that it can observe the mark pairs arranged at various positions. The illumination unit incorporated in the alignment scope can include at least one of, for example, a halogen lamp, an LED, a Laser, and the like. Alignment measurement light 19 from the illumination unit illuminates the mark pair, and the image capturing unit can capture the image formed by the light from the mark pair.

The controller 20 can control the operation, adjustment, and the like of each of the above-described components of the imprint apparatus 1. The controller 20 can be formed from, for example, a PLD (the abbreviation of a Programmable Logic Device) such as an FPGA (the abbreviation of a Field Programmable Gate Array), an ASIC (the abbreviation of an Application Specific Integrated Circuit), a general-purpose or dedicated computer installed with a program, or a combination of all or some of these components. As will be described later in detail, the controller 20 can change the control information of alignment by the alignment mechanism AA in accordance with the change of the irradiation condition of light by the curing device 2.

In addition to the components described above, the imprint apparatus 1 can include a base plate 21 for supporting the substrate driving mechanism 11, a support plate 23 for supporting the mold driving mechanism 5, columns 22 that support the support plate 23, and the like.

FIG. 3 shows the operation sequence for forming, in the imprint apparatus 1, a pattern made of the cured product of the curable composition 16 on each of a plurality of the substrates 15 forming one lot. This operation sequence is controlled by the controller 20. In this example, the same mold 17 is used for the plurality of the substrates 15 forming one lot.

In step S1, the controller 20 controls a mold conveyance mechanism (not shown) to load the mold 17 to the mold driving mechanism 5, and causes the mold holding unit 7 to hold the mold 17. Next, in step S2, the controller 20 adjusts the position of the alignment scope so that the mark pair to be measured enters the measurement field of view of the alignment scope of the alignment measurement device 18. In step S3, the controller 20 controls a substrate conveyance mechanism (not shown) to load the substrate 15 onto the substrate stage 12, and causes the substrate stage 12 to hold the substrate 15.

Next, in step S4, the controller 20 controls supply of the curable composition 16 onto the shot region of the substrate 15. This can be performed by discharging the curable composition 16 from the dispenser 14 while scan-driving the substrate 15 by the substrate driving mechanism 11. Next, in step S5, the controller 20 controls the relative driving mechanism 30 to bring the curable composition 16 on the shot region of the substrate 15 into contact with the pattern region of the mold 17. In addition, in step S5, the controller 20 controls the alignment mechanism AA so as to perform an alignment operation between the shot region of the substrate 15 and the pattern region of the mold 17. The alignment operation is an operation of detecting an alignment error by using the alignment measurement device 18, and reducing the alignment error by the alignment mechanism AA. Detection of an alignment error can include detection of the positional shift and shape difference between the shot region and the pattern region by measuring the relative position between the substrate-side mark 26 and the mold-side mark 25 for each of the plurality of mark pairs by using the alignment measurement device 18. The alignment operation in step S5 can be continued until it is determined that a predetermined filling time has elapsed in step S6. The predetermined filling time can be the time decided such that the curable composition 16 is sufficiently filled into the space defined between the surface of the shot region of the substrate 15 and the surface of the pattern region of the mold 17.

After the predetermined filling time has elapsed, in step S7, the controller 20 controls the curing device 2 to cure the curable composition 16 by irradiating the curable composition 16 between the substrate 15 and the mold 17 with the light 3. In addition, in step S7, the controller 20 controls the relative driving mechanism 30 to separate the mold 17 from the cured product of the curable composition 16. With this, the cured product of the curable composition 16 with the pattern of the pattern region of the mold 17 transferred thereto remains on the shot region of the substrate 15.

In step S8, the controller 20 determines whether the processing from step S4 to step S7 has been performed for all the shot regions of the substrate 15. If there is an unprocessed shot region, the processing from step S4 to step S7 is performed on the unprocessed shot region. On the other hand, if the processing from step S4 to step S7 has been performed for all the shot regions, the substrate 15 is unloaded from the substrate stage 12 in step S9.

In step S10, the controller 20 determines whether the processing from step S3 to step S8 has been performed for all the substrates 15 to be processed. If there is the unprocessed substrate 15, the processing from step S3 to step S8 is performed on the unprocessed substrate. On the other hand, if the processing from step S3 to step S8 has been performed for all the substrates 15, the mold 17 is unloaded from the mold holding unit 7 in step S10, and the process shown in FIG. 3 ends.

Figure 4:
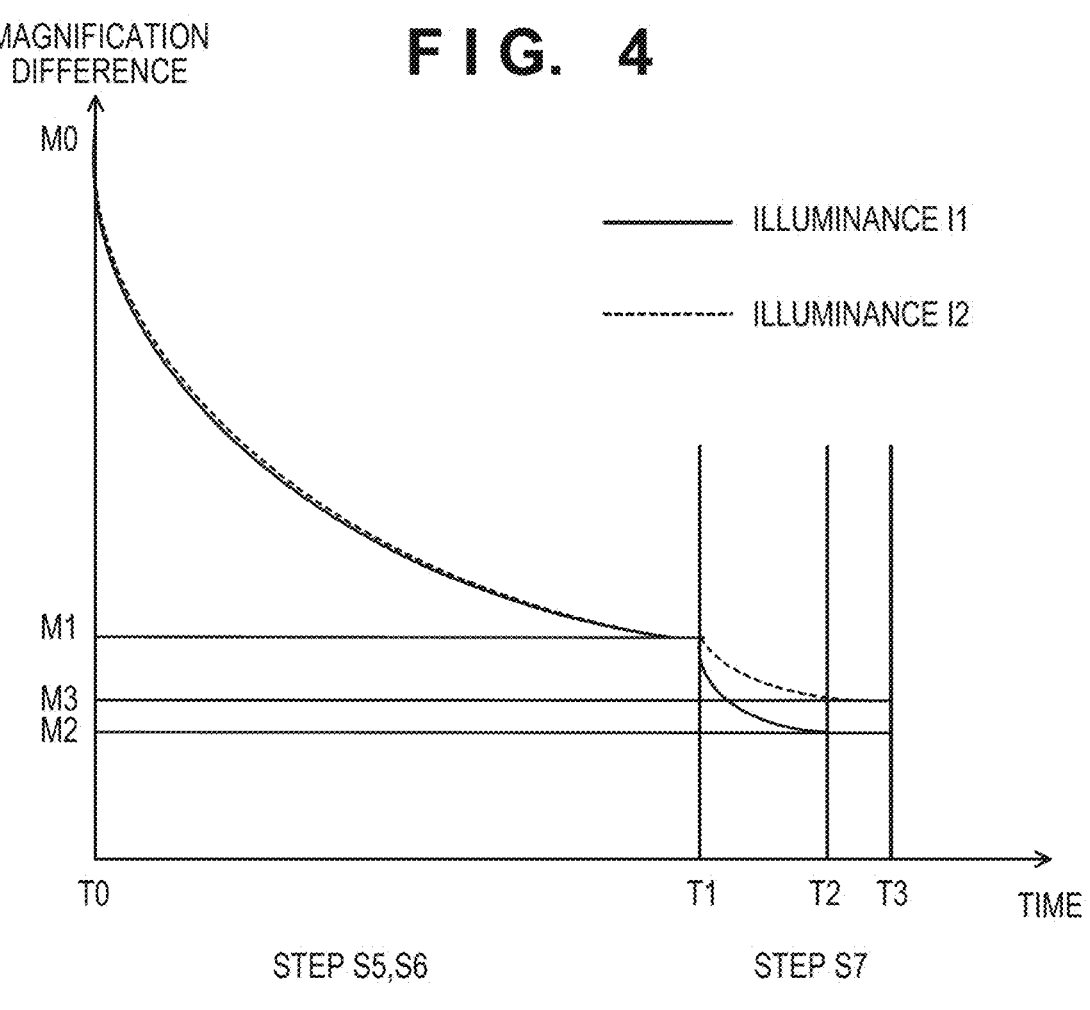
FIG. 4 is a graph showing an example of shape control of a mold by a mold deformation mechanism.

FIG. 4 schematically shows the shape control of the mold 17 by the mold deformation mechanism 8 of the alignment mechanism AA as an example of control in the alignment operation performed by the alignment mechanism AA in steps S5 to S7 of FIG. 3. As a specific example, the magnification control of the mold 17 by the mold deformation mechanism 8 will be described here, which can be understood as an example of the shape control of the mold 17 by the mold deformation mechanism 8. In FIG. 4, the ordinate represents the magnification difference between the pattern region of the mold 17 and the shot region of the substrate 15, and the abscissa represents time. The magnification difference can be detected by measuring the relative shift amount between the mold-side mark 25 and the substrate-side mark 26 for each of the plurality of mark pairs by using the alignment measurement device 18.

At time T=T0, the magnification difference is an initial magnification difference M0. From this state, by performing steps S5 and S6, the magnification difference is reduced to a target magnification difference M1 before starting step S7 (before irradiation of the light 3). More specifically, the controller 20 controls the mold deformation mechanism 8 such that the magnification difference detected using the alignment measurement device 18 matches the target magnification difference M1, thereby adjusting the magnification of the mold 17. In the period from time T0 to time T1 of FIG. 4, in parallel with the operation of reducing the magnification different to the target magnification difference M1, the curable composition 16 is filled into the space between the shot region and the pattern region. After the predetermined filling time has elapsed, steps S5 and S6 can end.

Next, in step S7, the curing device 2 irradiates the curable composition 16 with the curing light 3. Here, the change of the alignment state (magnification difference) in each of two irradiation conditions, more specifically, two illuminances I1 and I2 (I1>I2) will be exemplarily described. First, a case where the illuminance of the curing light 3 is I1 will be described. In FIG. 4, the change of the magnification difference in the case of the illuminance I1 is indicated by a solid line. At time T1, the curing device 2 starts to irradiate the curable composition 16 with the curing light 3. This can be implemented by, for example, using a shutter mechanism capable of switching the optical path of the light 3 from a blocked state to a non-blocked state or by controlling the light source 4 from the turn-off state to the turn-on state. At time T2, the curing device 2 finishes the irradiation of the curable composition 16 with the curing light 3. This can be implemented by, for example, using the shutter mechanism capable of switching the optical path of the light 3 from the non-blocked state to the blocked state or by controlling the light source 4 from the turn-on state to the turn-off state. The irradiation time of the light 3 is expressed by (T2–T1). The irradiation time (T2–T1) can be decided based on the necessary exposure amount for sufficiently curing the curable composition 16 and the illuminance I1 of the light 3. Due to the irradiation of the curable composition 16 with the light 3, the magnification difference changes from M1 at time T1 to M2 at time T2. This change can occur due to a phenomenon called curing shrinkage of the curable composition 16. The magnification difference M2 is the final shot magnification by the imprint process. In step S7, the curable composition 16 is cured by the irradiation operation of the light 3. Accordingly, in step S7, the mold deformation mechanism 8 cannot sufficiently deform the mold 17. Therefore, the target magnification difference M1 in steps S5 and S6 can be decided in consideration of the fluctuation due to the curing shrinkage of the curable composition 16 so that the final magnification difference (alignment difference or overly difference) matches the magnification difference M2.

Next, a case where the illuminance of the curing light 3 is I2 will be described. In FIG. 4, the change of the magnification difference in the case of the illuminance I2 is indicated by a dashed line. The process (adjustment) to change the illuminance is performed to, for example, reduce the alignment error or the like. In addition, the illuminance can change due to deterioration with time of the light source 4. In the operation from time T0 to time T1, the curable composition 16 is not irradiated with the light 3, so that the change of the magnification difference in the case of the illuminance I2 is similar to that in the case of the illuminance I1. In the case of the illuminance I2, the curable composition 16 can be irradiated with the light 3 in the period from time T1 to time T3. The irradiation time changes between the case of the illuminance I1 and the case of the illuminance I2 because the illuminance changes while the necessary exposure amount for curing the curable composition 16 is constant regardless of the illuminance. Due to the irradiation time (T3–T1) in the case of the illuminance I2, the magnification difference (alignment error or overlay error) changes from M1 at time T1 to M3 at time T3. The final magnification difference M3 in the case of the illuminance I2 and the final magnification difference M2 in the case of the illuminance I1 are values different from each other. The final magnification difference (alignment error or overlay error) changes due to the change of the illuminance because the curing shrinkage rate of the curable composition 16 during curing changes depending on the illuminance and exposure amount of the light 3.

If the magnification difference (alignment error or overlay error) changes due to the change of the illuminance of the light 3 emitted to the curable composition 16, the yield may decrease. Hence, in the imprint apparatus 1, it is desirable that the change of the alignment error (in the above example, magnification error) is insensitive to the change of the irradiation condition (in the above example, illuminance) of light by the curing device 2.

Therefore, the controller 20 can change the control information of alignment by the alignment mechanism AA in accordance with the change of the irradiation condition of the light 3 by the curing device 2. The change of the irradiation condition of the light 3 by the curing device 2 may be caused by a process of intentionally adjusting the irradiation condition of the light 3 by the controller 20 or another component, or may be unintentionally caused by deterioration of the light source 4 or the like. For example, when the curing device 2 includes the adjustment function (adjustment unit 9) of adjusting the illuminance of the light 3, the former intentional adjustment can be performed through the adjustment function. Alternatively, when the curing device 2 has a plurality of selectable irradiation modes, the intentional adjustment can be performed by the controller 20 selecting the irradiation mode.

In this embodiment, the characteristic information indicating the relationship between the irradiation condition of the light 3 with respect to the curable composition 16 and the alignment error is generated in advance. The process for generating the characteristic information can be performed by, for example, the controller 20. When performing the operation sequence shown in FIG. 3, the controller 20 can change (or decide) the control information of alignment by the alignment mechanism AA based on the characteristic information and the irradiation condition. Alternatively, when performing the operation sequence shown in FIG. 3, the controller 20 can change the control information of alignment by the alignment mechanism AA based on the characteristic information in accordance with the change of the irradiation condition.

The generation of the characteristic information will be exemplarily described below. First, the controller 20 forms samples by performing an imprint process on the shot region of the substrate 15 under each irradiation condition while changing the irradiation condition of the light 3 with respect to the curable composition 16 by changing an instruction value given to the adjustment unit 9. Here, the imprint process is a process of forming a pattern made of the cured product of the curable composition 16. Thereafter, the alignment error or overlay error (for example, magnification error) in each sample can be detected by using the alignment measurement device 18 in the imprint apparatus 1 or by an external inspection apparatus. By processing detection results obtained in this manner, the controller 20 can generate the characteristic information.

Figure 5:
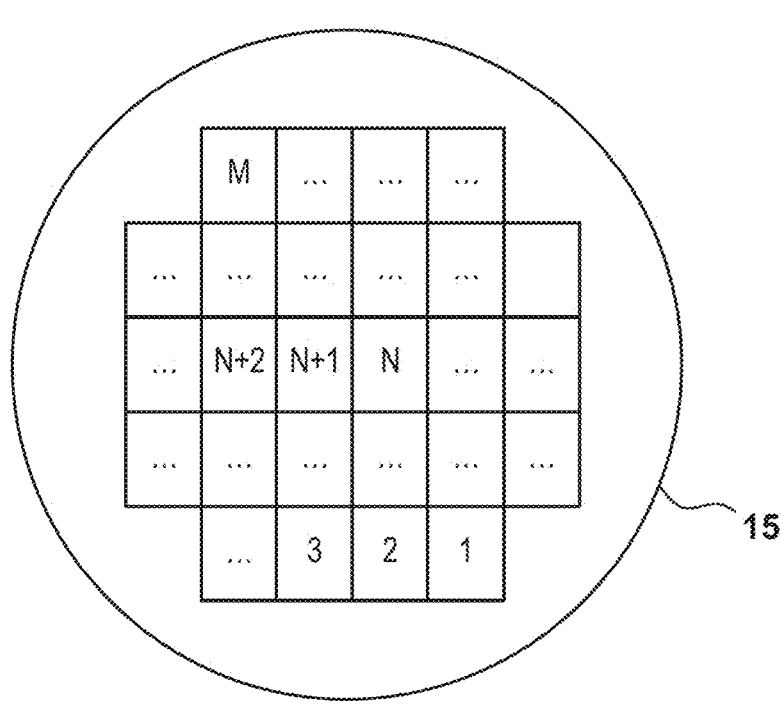
FIG. 5 is a view exemplarily showing the arrangement of a plurality of shot regions of a substrate.

In an example, the substrate 15 including a plurality of shot regions as schematically shown in FIG. 5 is prepared, and the imprint process can be performed with each of a plurality of illuminances decided so as to sufficiently cover the range of illuminance that can be used in the imprint process for main production. In FIG. 5, each shot region is indicated by a rectangle, and shot numbers 1, 2, 3, . . . , N, N+1, N+2, . . . are given to the shot regions as the shot region identification IDs. In FIG. 6, the illuminance applied to the imprint process on each shot region of the substrate 15 exemplarily shown in FIG. 5 is exemplarily shown as I0, I0+ΔI, . . . . In the example shown in FIGS. 5 and 6, there are M shot regions, and an illuminance change width ΔI is decided by equally dividing the range of illuminance that can be used in the imprint process for main production by M. The illuminance I0 is the minimum illuminance in the range of illuminance. In the shot region of shot number 1, during the imprint process, after alignment, the curable composition 16 is irradiated with the curing light 3 having the minimum illuminance I0 to cure the curable composition 16. In the shot region of shot number 2, during the imprint process, after alignment, the curable composition 16 is irradiated with the curing light 3 having the illuminance expressed by the minimum illuminance I0+ΔI to cure the curable composition 16.

FIG. 7 schematically shows characteristic information 27 obtained by measuring the substrate 15 having undergone the imprint process on each shot region as described above, by using the alignment measurement device 18 in the imprint apparatus 1 or by an external inspection apparatus. In the example shown in FIG. 7, the irradiation condition is the illuminance (setting illuminance), and the alignment error is the magnification error. The characteristic information 27 can be stored in a memory of the controller 20. The characteristic information 27 can be generated or prepared for each kind of the curable compositions 16 that can be used in the imprint process. This is because the curing shrinkage rate changes for each kind of the curable composition 16. The characteristic information 27 can be generated or prepared for each specification or identification ID of the mold 17 that can be used in the imprint process. This is because the alignment error with respect to the irradiation condition changes for each specification or identification ID of the mold 17.

The imprint process for main production will be exemplarily described below. Here, as an example, consider the imprint apparatus 1 in which the control information of alignment by the alignment mechanism AA is adjusted (optimized) in the initial state in which the illuminance of the light 3 emitted to the curable composition is set to I1. In addition, consider a case where the illuminance of the light 3 changes from I1 to I2 after the initial state. The change from I1 to I2 may be caused intentionally or unintentionally. The controller 20 can refer to the characteristic information 27, and decide the alignment correction amount (the correction amount of the control information of alignment) based on the difference (M3−M2) between the magnification difference M2 corresponding to the illuminance I1 before the change of the illuminance and the magnification difference M3 corresponding to the illuminance I2 after the change of the illuminance. In a broader sense, the controller 20 can refer to the characteristic information 27, and decide the alignment correction amount (the correction amount of the control information of alignment) based on the difference (M3−M2) between the alignment error before the change of the irradiation condition and the alignment error after the change of the irradiation condition. The alignment correction amount is decided such that the alignment error (overlay error) between the shot region and the pattern region (the cured product of the curable composition 16) falls within an allowable range (magnification difference M2 here) at time T3 (that is, after curing).

When deciding the alignment correction amount, the illuminance value set in a recipe (a control file for controlling the imprint process) may not exist in the characteristic information 27. In this case, the alignment correction amount may be decided using data closest to the illuminance value set in the recipe among a plurality of data included in the characteristic information 27. Alternatively, the alignment correction amount may be decided by complementing two or more data near the illuminance value set in the recipe among the plurality of data included in the characteristic information 27.

FIG. 8 schematically shows an example of the alignment operation in a case where the alignment correction amount decided in accordance with the change of the irradiation condition is reflected on the alignment target value (control information of alignment). As an example of control of alignment by the alignment mechanism AA when the illuminance of the light 3 is I2, FIG. 8 schematically shows shape control of the mold 17 by the mold deformation mechanism 8 of the alignment mechanism AA. As a specific example, the magnification control of the mold 17 by the mold deformation mechanism 8 will be described here, which can be understood as an example of the shape control of the mold 17 by the mold deformation mechanism 8. The ordinate represents the magnification difference (to be also understood as the alignment error or the overlay error) between the pattern region of the mold 17 and the shot region of the substrate 15, and the abscissa represents time. In FIG. 8, a dashed line indicates the change of the magnification difference in alignment in a comparative example, that is, in a case where the illuminance is I2 and the alignment correction according to this embodiment is not performed. This is the case same as that indicated by the dashed line in FIG. 4. In the comparative example, the magnification difference (magnification difference after curing) at the end of the imprint process, that is, at time T3 is M3, which is different from the magnification difference M2 at the end of the imprint process when the illuminance is I1 (see FIG. 4).

In this embodiment, the controller 20 changes the target magnification difference (target alignment error) at time T1 at the end of the alignment step in steps S5 and S6, that is, the control information of alignment from M1 to M4 based on the alignment correction amount described above. Then, the controller 20 controls alignment by the alignment mechanism AA based on the changed target magnification difference M4. The target magnification difference M4 can be decided as, for example, M4=M1−(M3−M2). Alignment in this embodiment is indicated by an alternate long and short dashed line in FIG. 8. The magnification difference at the end of step S7 (time T3), that is, after curing becomes the same value as the final magnification difference M2 in the imprint with the illuminance I1 shown in FIG. 4.

As has been described above, the controller 20 performs alignment correction using the characteristic information 27 in accordance with the change of the irradiation condition of the light 3 by the curing device 2. In other words, the controller 20 changes the control information (target magnification difference M4 here) of alignment by the alignment mechanism AA in accordance with the change of the irradiation condition of the light 3 by the curing device 2. With this, it is possible to reduce the change of the alignment error (normally, an increase of the alignment error) caused by the change of the irradiation condition, thereby suppressing a decrease in yield.

As a modification, another method for deciding the alignment correction amount will be exemplarily described below. The change of the alignment error (magnification error) exemplarily shown in FIG. 4 is detected by measuring the relative shift amount between the mold-side mark 25 and the substrate-side mark 26 by using the alignment measurement device 18 for a plurality of mark pairs. Hence, the magnification difference M3 at time T3 at the end of step S7 in the case where the illuminance of the light 3 is I2 can be measured using the alignment measurement device 18. That is, the magnification difference M3 and the magnification difference M2 at time T3 at the end of the imprint process can be measured using the alignment shift amount M3. The target magnification difference M4 can be obtained by calculation of M4=M1−(M3−M2) as has been described above. Therefore, for example, in the lot for main production, the imprint process is experimentally performed using at least one shot region of at least one substrate to form a sample, and the magnification difference of the sample is measured using the alignment measurement device 18. By using the difference between the magnification difference obtained by the measurement and the original target magnification difference, the alignment correction amount is decided. In the imprint process for the remaining shot region of the substrate, alignment is performed while reflecting the decided alignment correction amount. Thus, alignment satisfying the target magnification difference can be implemented. According to this method, there is an advantage that a process for obtaining the characteristic information in advance is unnecessary.

So far, the example in which the illuminance is mainly focused as the irradiation condition of the light 3 with respect to the curable composition 16 has been described. However, also in a case where the irradiation condition other than the illuminance of the light 3 emitted to the curable composition 16, for example, the exposure amount thereof changes, the alignment correction amount (control information of alignment) can be decided by a similar process. When the exposure amount changes, the incident energy to the substrate 15 and the mold 17 changes. Accordingly, the heat amount applied to the substrate 15 and the mold 17 changes. Hence, the deformation amount of each of the substrate 15 and the mold 17 caused by heat changes, and the alignment error (magnification difference) can also change. Also for this change of the magnification difference, it is possible to decide the alignment correction amount by the above-described method, and control alignment based on the alignment correction amount. Note that changing the exposure amount can be implemented by, for example, changing the irradiation time of the curable composition with the light 3 or changing the illuminance by the adjustment unit 9 without changing the irradiation time.

Furthermore, also for a case where the illuminance distribution of the light 3 in the shot region is changed, it is possible to decide the alignment correction amount by the above-described method, and control alignment based on the alignment correction amount. By adjusting the illuminance distribution of the light 3 in the shot region, the heat distribution corresponding to the illuminance distribution can be formed in the shot region. With this, the deformation amount of each of the substrate 15 and the mold 17 caused by heat changes, and the alignment error (magnification difference) can change. By adjusting the illuminance distribution in the shot region, the high-order component of the shape of the shot region can be adjusted. With this, the alignment error for the high-order component can also be reduced. Also in this case, it is possible to decide the alignment correction amount by the above-described method, and control alignment based on the alignment correction amount. Note that when the alignment error in the case of changing the illuminance distribution is measured using the alignment measurement device 18, it is desirable to provide the number of alignment scopes corresponding to the measured high-order components in the alignment measurement device 18.

The pattern of a cured product formed using an imprint apparatus is used permanently for at least some of various kinds of articles or temporarily when manufacturing various kinds of articles. The articles are an electric circuit element, an optical element, a MEMS, a recording element, a sensor, a mold, and the like. Examples of the electric circuit element are volatile and nonvolatile semiconductor memories such as a DRAM, an SRAM, a flash memory, and an MRAM and semiconductor elements such as an LSI, a CCD, an image sensor, and an FPGA. The mold includes an imprint mold or the like.

The pattern of the cured product is directly used as at least some of the constituent members of the above-described articles or used temporarily as a resist mask. After etching or ion implantation is performed in the substrate processing step, the resist mask is removed.

An article manufacturing method in which an imprint apparatus forms a pattern on a substrate, processes the substrate on which the pattern is formed, and manufactures an article from the processed substrate will be described next. As shown FIG. 9A, a substrate 1z such as a silicon wafer with a processed material 2z such as an insulator formed on the surface is prepared. Next, an imprint material 3z is applied to the surface of the processed material 2z by an inkjet method or the like. A state in which the imprint material 3z is applied as a plurality of droplets onto the substrate is shown here.

As shown in FIG. 9B, a side of a mold 4z for imprint with a concave-convex pattern is directed toward and made to face the imprint material 3z on the substrate. As shown FIG. 9C, the substrate 1z to which the imprint material 3z is applied is brought into contact with the mold 4z, and a pressure is applied. The gap between the mold 4z and the processed material 2z is filled with the imprint material 3z. In this state, when the imprint material 3z is irradiated with light as energy for curing via the mold 4z, the imprint material 3z is cured.

As shown in FIG. 9D, after the imprint material 3z is cured, the mold 4z is separated from the substrate 1z, and the pattern of the cured product of the imprint material 3z is formed on the substrate 1z. In the pattern of the cured product, the concave portion of the mold corresponds to the convex portion of the cured product, and the convex portion of the mold corresponds to the concave portion of the cured product. That is, the concave-convex pattern of the mold 4z is transferred to the imprint material 3z.

As shown in FIG. 9E, when etching is performed using the pattern of the cured product as an etching resistant mask, a portion of the surface of the processed material 2z where the cured product does not exist or remains thin is removed to form a groove 5z. As shown in FIG. 9F, when the pattern of the cured product is removed, an article with the grooves 5z formed in the surface of the processed material 2z can be obtained. Here, the pattern of the cured product is removed. However, instead of removing the pattern of the cured product after the process, it may be used as, for example, an interlayer dielectric film included in a semiconductor element or the like, that is, a constituent member of an article.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2023-094909, filed Jun. 8, 2023, which is hereby incorporated by reference herein in its entirety.

What is claimed is:

1. An imprint apparatus that forms a pattern of a curable composition on a substrate by using a mold, comprising:

an alignment mechanism configured to perform alignment between a shot region of the substrate and a pattern region of the mold;

a curing device configured to cure the curable composition between the shot region and the pattern region by irradiating the curable composition with light; and a controller configured to change control information of the alignment by the alignment mechanism in accordance with a change of an irradiation condition of light by the curing device.

2. The apparatus according to claim 1, wherein the alignment includes reduction of a shape difference between the shot region and the pattern region.

3. The apparatus according to claim 1, wherein the alignment includes reduction of a magnification difference between the shot region and the pattern region.

4. The apparatus according to claim 1, wherein the control information includes a target alignment error between the shot region and the pattern region at an end of the alignment by the alignment mechanism.

5. The apparatus according to claim 4, wherein the controller changes the target alignment error at the end of the alignment based on a difference between an overlay error occurring between the shot region and the cured curable composition under the irradiation condition before the change and an overlay error occurring between the shot region and the cured curable composition under the irradiation condition after the change.

6. The apparatus according to claim 4, wherein the controller changes the control information based on characteristic information prepared in advance, and the characteristic information is information indicating a relationship between the irradiation condition and an overlay error occurring between the shot region and the cured curable composition.

7. The apparatus according to claim 6, wherein a curing shrinkage rate of the curable composition during curing changes due to the change of the irradiation condition, and the controller changes the target alignment error at the end of the alignment by the alignment mechanism so as to reduce a fluctuation of the overlay error which occurs due to the change of the curing shrinkage rate.

8. The apparatus according to claim 1, wherein the irradiation condition includes a condition regarding an illuminance.

9. The apparatus according to claim 1, wherein the irradiation condition includes a condition regarding an exposure amount.

10. An imprint method that comprises performing alignment between a shot region of a substrate and a pattern region of a mold, and curing a curable composition between the shot region and the pattern region by irradiating the curable composition with light after the performing alignment, the method comprising changing control information for controlling the alignment in the performing alignment in accordance with a change of an irradiation condition of light in the curing.

11. The method according to claim 10, further comprising performing a process to change the irradiation condition, wherein, in the changing, the control information is changed in accordance with the change of the irradiation condition by the process.

12. The method according to claim 10, wherein the alignment includes reduction of a shape difference between the shot region and the pattern region.

13. The method according to claim 10, wherein the alignment includes reduction of a magnification difference between the shot region and the pattern region.

14. The method according to claim 10, wherein the control information includes a target alignment error between the shot region and the pattern region at an end of the performing alignment.

15. The method according to claim 14, wherein in the changing, the target alignment error at the end of the alignment is changed based on a difference between an overlay error occurring between the shot region and the cured curable composition under the irradiation condition before the change and an overlay error occurring between the shot region and the cured curable composition under the irradiation condition after the change.

16. The method according to claim 14, wherein in the changing, the control information is changed based on characteristic information prepared in advance, and the characteristic information is information indicating a relationship between the irradiation condition and an overlay error occurring between the shot region and the cured curable composition.

17. The method according to claim 16, wherein a curing shrinkage rate of the curable composition during curing changes due to the change of the irradiation condition, and in the changing, the target alignment error at the end of the performing alignment is changed so as to reduce a fluctuation of the overlay error which occurs due to the change of the curing shrinkage rate.

18. The method according to claim 10, wherein the irradiation condition includes a condition regarding an illuminance.

19. The method according to claim 10, wherein the irradiation condition includes a condition regarding an exposure amount.

20. An article manufacturing method comprising:
forming a pattern of a curable composition on a substrate by an imprint method defined in claim 10; and
obtaining an article by processing the substrate having undergone the forming.

* * * * *